(12) United States Patent
Shiflet

(10) Patent No.: US 6,423,572 B1
(45) Date of Patent: Jul. 23, 2002

(54) COMPATIBLE IC PACKAGES AND METHODS FOR ENSURING MIGRATION PATH

(75) Inventor: Eric M. Shiflet, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/925,288

(22) Filed: Aug. 8, 2001

Related U.S. Application Data

(62) Division of application No. 09/281,751, filed on Mar. 30, 1999, now Pat. No. 6,297,565.
(60) Provisional application No. 60/080,176, filed on Mar. 31, 1998.

(51) Int. Cl.[7] .......................... H01L 21/44; H01L 21/48; H01L 21/50; H01L 21/82
(52) U.S. Cl. ........................ 438/106; 438/107; 438/128; 438/617
(58) Field of Search ................................ 438/106, 107, 438/108, 128, 453, 615, 612, 613, 617

(56) References Cited

U.S. PATENT DOCUMENTS

| | | |
|---|---|---|
| 4,990,996 A | 2/1991 | Kumar et al. |
| 5,036,163 A | 7/1991 | Spielberger et al. |
| 5,360,767 A | 11/1994 | Narrayanan et al. |
| 5,650,660 A | 7/1997 | Barrow |
| 5,703,402 A | 12/1997 | Chu et al. |
| 5,798,571 A | 8/1998 | Nakajima |
| 5,923,540 A | 7/1999 | Asada et al. |
| 5,952,726 A | 9/1999 | Liang |
| 6,033,936 A * | 3/2000 | Tanaka ...................... 438/106 |
| 6,057,596 A | 5/2000 | Lin et al. |
| 6,064,113 A | 5/2000 | Kirkman |
| 6,071,755 A | 6/2000 | Baba et al. |
| 6,101,710 A * | 8/2000 | Selinger et al. .............. 29/846 |
| 6,107,681 A * | 8/2000 | Lin ............................ 257/693 |

OTHER PUBLICATIONS

Texas Instruments, The MOS Memory Data Book, Texas Instruments Incorporated, Dallas, Texas, ICBN 0–89512–112–3, pp. 25–55 (1982).

* cited by examiner

*Primary Examiner*—Richard Elms
*Assistant Examiner*—Adam Pyonin
(74) *Attorney, Agent, or Firm*—Morrison & Foerster LLP

(57) ABSTRACT

The present invention relates to integrated circuit packaging useful for programmable logic devices. The invention provides a migration path between a base integrated circuit and an extended integrated circuit that is a functional superset of the base. In the case of a programmable logic device (PLD), the pin element layout for a base integrated circuit provides for the connection of power, control, and I/O signals. Pins conducting power signals are located at the core of the base pin layout. Pins conducting control signals are located near the intersections of the horizontal and vertical axes of the layout and the perimeter of the layout. Remaining pins conduct I/O signals. The pin element layout for an extended integrated circuit subsumes the base pin element layout. Additional pins for conducting power signals are located near one or more diagonal axes of the extended pin element layout. Methods for determining an extended integrated circuit pin element layout starting from a base pin element layout are disclosed.

9 Claims, 5 Drawing Sheets

COMPATIBLE IC PACKAGES AND METHODS FOR ENSURING MIGRATION PATH

CROSS-REFERENCE TO RELATED APPLICATIONS

This application is a divisional of U.S. application Ser. No. 09/281,751, filed on Mar. 30, 1999 now U.S. Pat. No. 6,297,565, which claims the benefit of U.S. Provisional Application No. 60/080,176, filed on Mar. 31, 1998.

BACKGROUND OF THE INVENTION

1. Field of the Invention

The invention relates to the field of integrated circuits, in particular to integrated circuit packaging.

2. Description of Related Art

Programmable logic device (PLD) integrated circuits have facilitated the miniaturization of electronic devices by permitting a design engineer to replace a large number of specific-function logic ICs with a single IC without the high cost of fabricating a custom integrated circuit. Programmable logic devices are often structured internally as a large array of identical functional logic elements. The exact functioning of each logical element and the interconnections between them is programmed into the PLD before operation. The internal architectures of PLD's can vary but frequently a number of PLD's will share the same internal architecture and operating characteristics and be marketed as a family. The distinction between members in the family is the total number of functional logic elements included in each member.

It is not uncommon for a design engineer working with a PLD to use a member of a device family having a large number of functional logic elements. This guarantees that an adequate number of logic elements will be available and usually permits the engineer to generate and process additional signals at design time that are useful for testing and troubleshooting. When the design is completed a smaller member of the PLD family is selected for production use to reduce costs. Up until now, however, this meant redesigning the circuit board that holds the PLD device. Despite their common internal architecture that allowed migration between different packages in the family, their external packaging did not readily support migration. Consequently, there is a need in the art for integrated circuit packaging that ensures a migration path between related integrated circuits.

SUMMARY OF THE INVENTION

The present invention relates to integrated circuit packaging useful for programmable logic devices. The invention provides a migration path between a base integrated circuit and an extended integrated circuit that is a functional superset of the base. In the case of a programmable logic device (PLD), the pin element layout for a base integrated circuit provides for the connection of power, control, and I/O signals. Pins conducting power signals are located at the core of the base pin layout. Pins conducting control signals are located near the intersections of the horizontal and vertical axes of the layout and the perimeter of the layout. Remaining pins conduct I/O signals.

The pin element layout for an extended integrated circuit subsumes the base pin element layout. Additional pins for conducting power signals are located near one or more diagonal axes of the extended pin element layout. Methods for determining an extended integrated circuit pin element layout starting from a base pin element layout are disclosed.

Use of the invention can eliminate the need to create multiple circuit boards for related designs, such as development and production model designs, or entry-level and enhanced product designs. Embodiments employing the invention may also enjoy simpler and more reliable internal construction.

These and other purposes and advantages of the present invention will become more apparent to those skilled in the art from the following detailed description in conjunction with the appended drawings.

DETAILED DESCRIPTION

Figure 1:
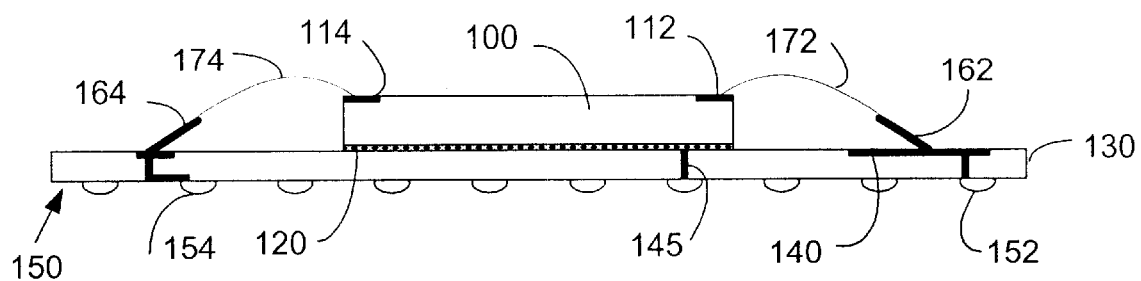
FIG. 1 depicts a cross-section of an integrated circuit (IC) package prior to final assembly.

A fuller appreciation of the present invention may be facilitated by considering certain construction details of one possible integrated circuit package construction useful in the practice of the invention. FIG. 1 depicts a cross-section of an integrated circuit (IC) package prior to final assembly. The illustrated components are not shown to scale. Chip 100 is the semiconductor die containing the device functional circuitry. Bonding pads 112, 114 are formed in chip 100 to present connection points to circuitry contained on the chip. The chip 100 is mounted to a base layer 130 by adhesive layer 120. Base layer 130 incorporates conductive paths along one or more of its surfaces, e.g., 140, and wholly or partially through it, e.g., 145. The conductive paths convey electrical signals between the set of pin elements 150 disposed along the bottom surface of base layer 130 located at the exterior of the finished IC package, and the top surface of base layer 130 located at the interior of the finished IC package. Lead frame contact pads 162, 164 electrically couple to conductive paths at the interior of the IC package. Bonding wires 172, 174 electrically connect lead frame contact pads 162, 164 to bonding pads on the chip 112, 114, respectively. In summary, conductive paths of the base layer, lead frame contact, and bonding wires electrically couple the bonding pads on the IC chip to the external pin elements.

Figure 2:
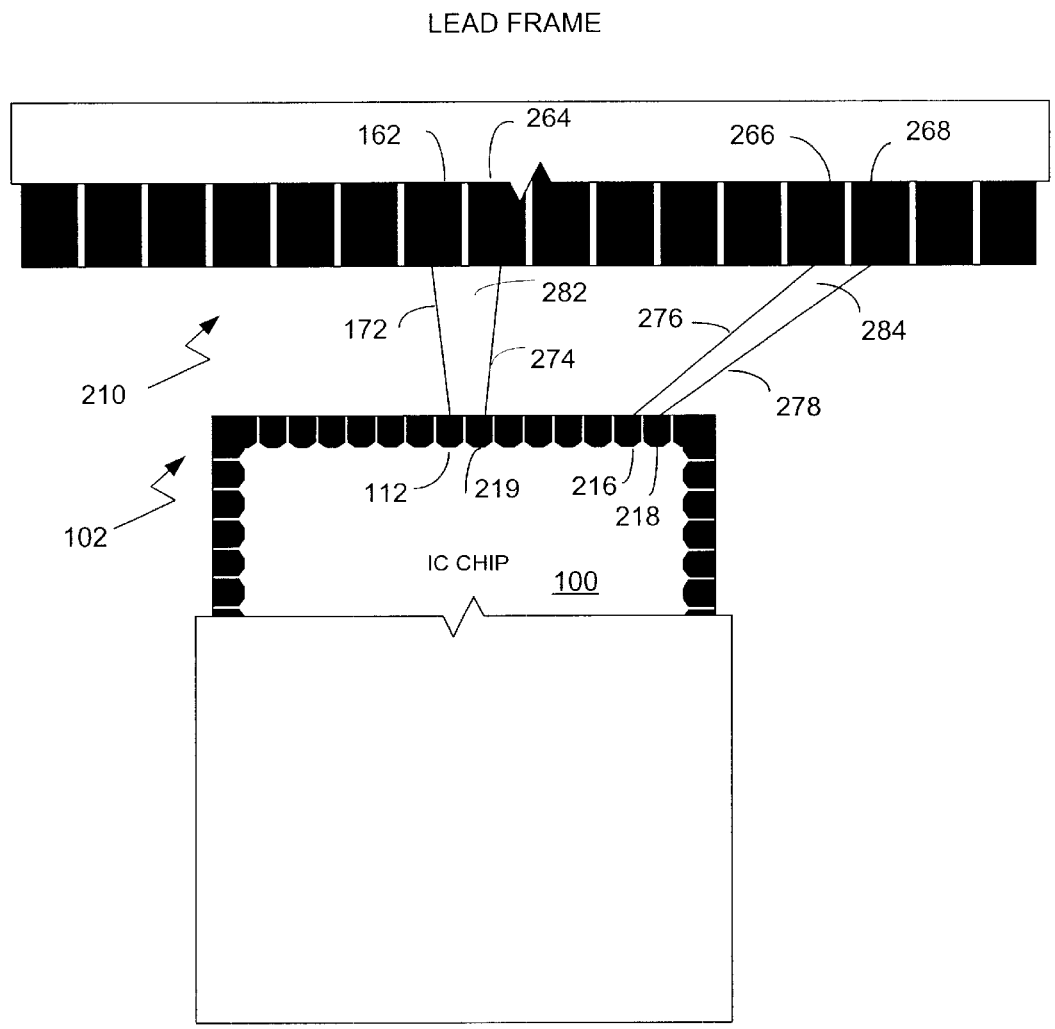
FIG. 2 illustrates exemplary wire bonding between an IC chip and a lead frame.

FIG. 2 illustrates exemplary wire bonding between an IC chip and a lead frame used in the construction discussed in reference to FIG. 1. FIG. 2 shows the top view of an IC chip 100 and a portion of the contact pads of a lead frame 210. Bonding wires 172, 274, 276, 278 electrically couple bonding pads 112, 214, 216, 218 to lead frame contact pads 162, 264, 266, 268, respectively.

Several details are noted regarding this construction. First, the bonding wires 172, 274, 276, 278 do not cross one another. Second, bonding wires 276, 278 connected to bonding pads located nearer the corners of the IC chip 216, 218 form sharper angles with respect to the edge of the chip from which they emerge 102, than bonding wires 172, 274 connected to bonding pads located nearer the mid-edge of the IC chip 112, 214. Third, bonding wires 276, 278 connected to adjacent bonding pads located nearer the corners of the IC chip 216, 218 have less interwire clearance 284 than the interwire clearance 282 of bonding wires 172, 274 connected to adjacent bonding pads located nearer the mid-edge of the IC chip 112, 214. One skilled in the art recognizes that the aforementioned geometry gives connections from mid-edge bonding pads superior electrical performance characteristics. These characteristics include, for example, lower resistance, lower inductance, and less crosstalk.

Figure 3:
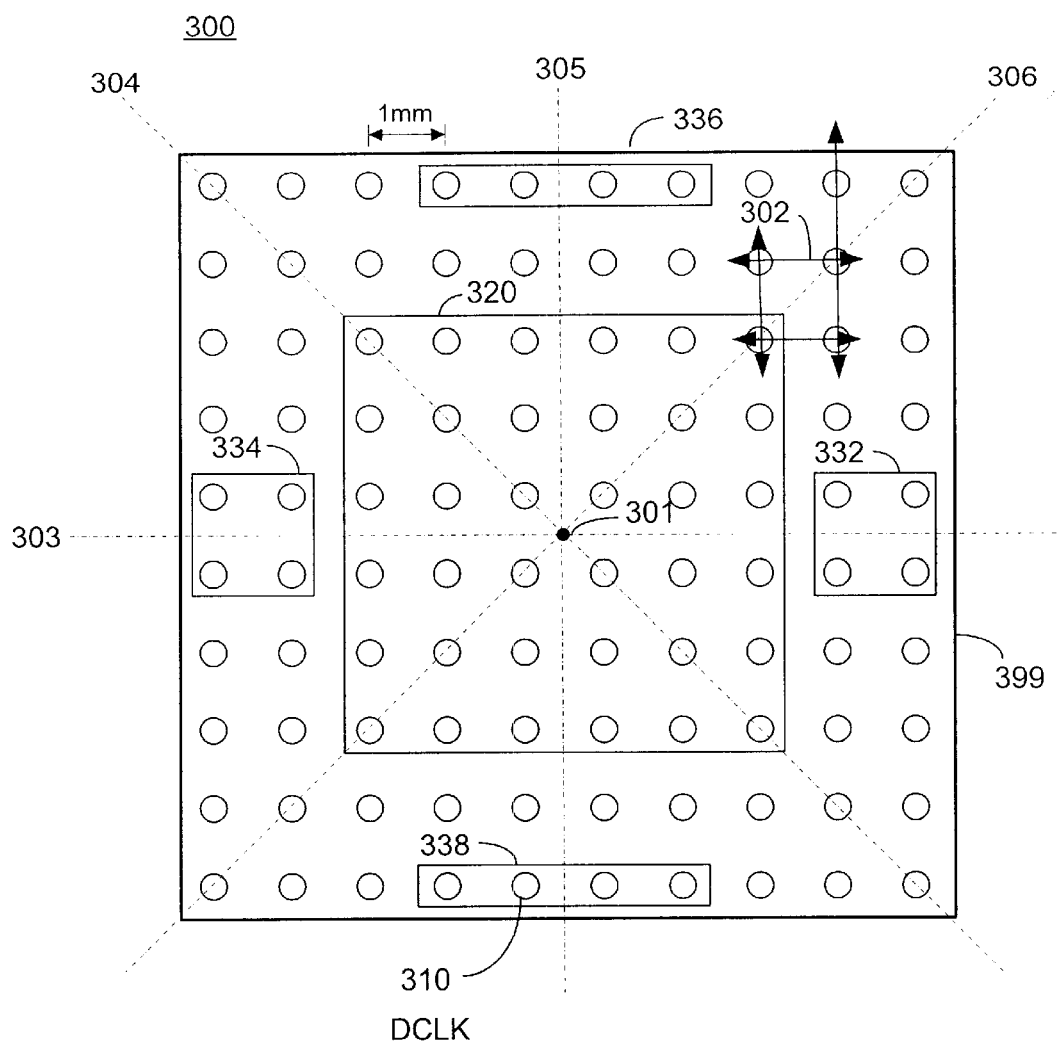
FIG. 3 depicts a representative pin element scheme, pattern, and layout for a base IC package.

FIG. 3 depicts a representative pin element scheme, pattern, and layout for a base IC package. FIG. 3 depicts a bottom view of an IC package employing the pin layout and including an IC chip with the base level of functionality. The IC package is constructed in accordance with FIGS. 1 and 2, already discussed. The base IC package has the smallest pin count among the anticipated IC packages for which inter-package migration is desired. Base pin element layout 300 is based on a square grid scheme 302 logically superimposed on the bottom surface of the IC package. This comports with the ball grid array design known and practiced in the art. Such a design places electrical contact points, i.e., pin elements, over a surface rather than just along edges as with the bonding and contact pads of the IC chip and lead frame.

Each intersection point of the grid scheme 302 represents a potential physical pin element location. The base layout 300 encompasses the same number of grid intersection points in both the horizontal and vertical dimensions resulting in a square layout perimeter 399 that is coextensive with the perimeter of the IC package. The presently described embodiment has a pin element pattern wherein a physical pin is populated at every available pin position defined by the scheme within the layout perimeter. Accordingly, an IC package employing base pin layout 300 has 100 pin elements arranged in 10 rows by 10 columns. One skilled in the art recognizes that many such layouts are possible including, for example, those not based on a grid scheme and those not populating every available pin position within the layout perimeter.

Each pin element of base layout 300 is an external contact that can be used to convey an electrical signal between external circuitry (not shown) and the IC chip. A programmable logic device (PLD) integrated circuit chip generally has three categories of signals brought to external contacts: power, control, and I/O.

Power signals connect the chip circuit elements to an operational power source. The power signals characteristically comprise a small number of unique signals with multiple pins assigned per signal. For example, a PLD may have three unique power signals, i.e., two independent supply voltage signals and a shared ground signal. One supply voltage powers internal logic and input buffers, with the other supply voltage powering output buffers. Conveyance of the three power signals may, however, utilize 36 pin elements in order to provide adequate current capacity and to easily distribute the signals throughout the chip. If the functionality of the base PLD is extended to provide more functional logic elements the number of unique power signals generally does not increase, but the number of pins required for those signals generally does increase in a linear fashion.

Control signals connect the chip circuit elements to external circuitry governing the operation of the PLD. The control signals characteristically comprise a relatively small number of unique signals with one pin assigned to each signal. For example, a PLD may have 16 unique control signals used for status indication, timing, synchronization, and configuration of the device. If the functionality of the base PLD is extended to provide more functional logic elements the number of unique control signals and, correspondingly, the number of pins required for those signals generally do not increase.

I/O signals connect the functional logic elements of the chip to external circuitry utilizing the logic functions provided by the PLD. The I/O signals characteristically comprise a relatively large number of unique signals with one pin assigned to each signal. While the signals are unique they are largely interchangeable. This is because each signal connects to a particular logic element in an array of logic elements, and the elements of the array are functionally equivalent to one another. If the functionality of the base PLD is extended to provide more functional logic elements, the number of unique I/O signals and, correspondingly, the number of pins required for those signals generally increases in a linear fashion.

It is further noted that an IC chip may have more signals presented at bonding pads than are actually brought out to pin elements. When chip circuit design is first performed it may be uncertain what the resulting chip die size will be and, therefore, the physical relationships between the die, the lead frame, and the IC package base many also be uncertain. The resulting die may have physical relationships with a chosen lead frame that make it impossible or undesirable to connect a bonding wire between every bonding pad on the chip and a lead frame contact pads. For example, the bonding wire angles near the corner bonding pads may be so sharp that adequate inter-wire spacing (discussed earlier in relation to FIG. 2) cannot be provided. In this case the optimal solution for the IC manufacturer may be to move forward with the resulting die and chosen lead frame by selectively omitting connections to some subset of circuitry on the chip. This approach often has applicability in PLD devices because a PLD frequently comprises a large set of identically functioning logical elements and the set can merely be truncated. The truncated PLD has fewer power and I/O signal pin requirements, but the number of control signals generally is not reduced.

Pin element layout 300 is produced by the assignment of particular signals to individual pins in the pin element pattern. The assignments of pin element layout 300 take into consideration the characteristics of the signal types just described. A number of pin elements located at or near the center point 301 of the pin element pattern form a central core subset 320. The central core subset 320 receives power signal assignments. Because many pins service a common power signal, conductive path runs between the pin elements and the IC chip can be converged. Because the circuit paths from pin elements of the central core subset 320 to the edges of the lead frame tend to be longer and more congested than the circuit paths from other pins, placing pins whose circuit paths can be converged in the center core can reduce the number of circuit paths that have to cross one another. This simplifies circuit path layout and potentially reduces the number of conductive layers that need to be incorporated into the base layer of the IC package. The associated reduction in cost and increase in reliability represent a distinct advantage of the present invention.

Furthermore, larger continuous areas of conductive material interconnecting these commonly assigned pins can be designed into in the :base layer. This can increase the ability of the IC packaging to conduct heat away from the chip when the chip is mounted in the package over the core of power pins. The improved thermal conductance represents a further advantage of the present invention.

A subset of pin elements located near the perimeter 399 of the base pin element pattern, and near its intersection points with orthogonal horizontal 303 and vertical 305 axes running through center point 301, receives control signal assignments. For example, pin element 310 receives the signal assignment denoted as "DCLK." Pin groups 332, 334, 336, and 338 comprise the control signal subset. Such positioning of the control signal pins facilitates comparatively short and direct conductive paths to mid-edge contact pads of the lead frame for both an IC package utilizing the base pin layout and an extended functionality IC package that subsumes the base pin layout (as will be discussed in reference to FIG. 4).

Pins that are outside of the power core pin element subset 320 and outside of the control signal pin element subset comprising pin groups 332, 334, 336, and 338, receive I/O signal assignments.

It is noted that functional assignments for individual pins are integral to base layout 300 but are omitted from FIG. 3, except for that of pin element 310, in order not to obscure the drawing with unnecessary detail.

Figure 4:
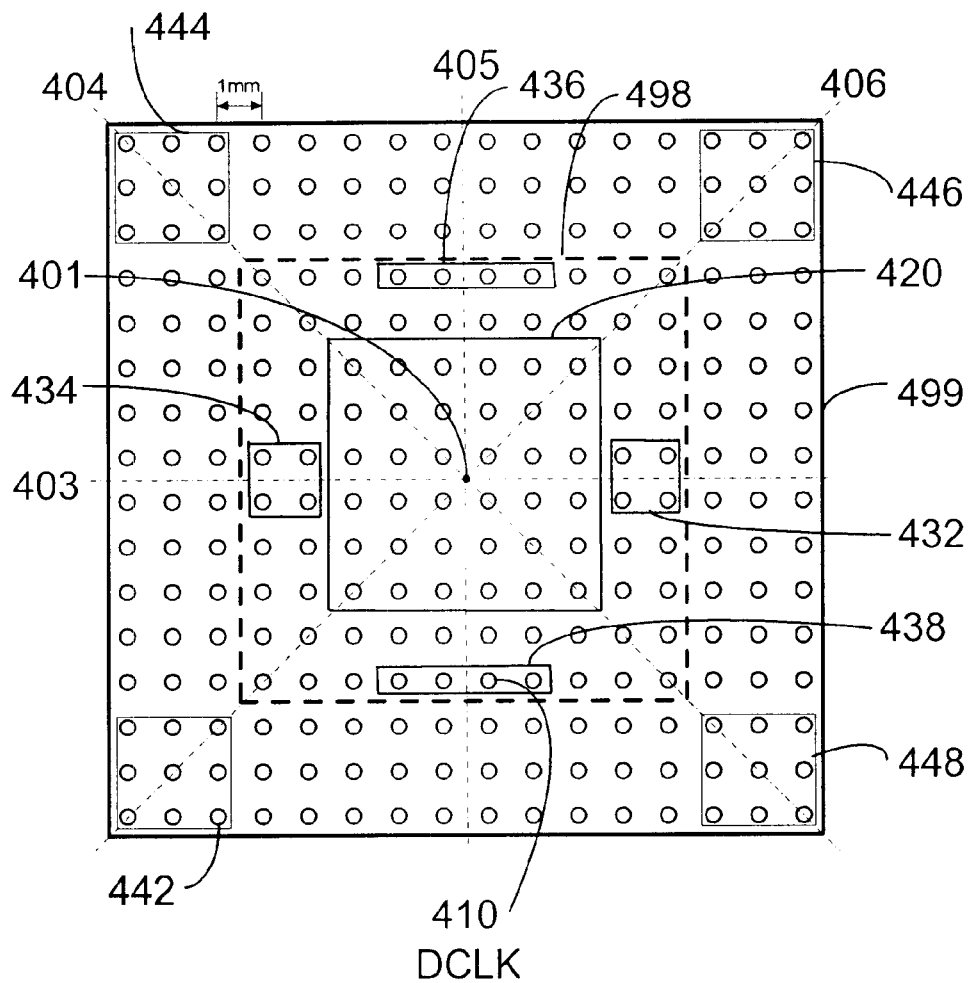
FIG. 4 depicts a representative pin element pattern and layout for an extended IC package.

FIG. 4 depicts a representative pin element pattern and layout for an extended IC package. The extended IC package is designed to include a chip having the functionality of a base chip plus some increment of functionality. For the presently described programmable logic devices the extended IC package generally includes an increment in the number of functional logic elements. For example, an EPF6010A base PLD from Altera Corporation contains 880 useable logic elements, while the EPF6016A extended PLD from Altera Corporation contains 1,320 useable logic elements.

The extended IC pin layout 400 is the result of, and was the target of, a process used to ensure compatibility for migration between an IC package employing the extended pin layout 400 and an IC package employing the base pin layout 300 illustrated and discussed in reference to FIG. 3. Migration compatibility between a base and an extended IC permits, for example, the design of a printed circuit board, or other carrier, for an electronic apparatus that can accommodate either the base or extended IC. An engineer could then utilize the printed circuit board with an extended IC package during product design to make extra signals available for testing. When the design is finalized, the same printed circuit board could be used with a base IC package for production, without any redesign of the printed circuit board.

Similarly, a product could be made available with two different levels of functionality. Both versions of the product would employ the identical printed circuit board design but would differ in the components mounted to the circuit board. The entry-level version of the product would include an IC with the base pin layout, while the higher functionality version of the product would include an IC with the extended pin layout. The elimination of the need for multiple printed circuit board designs represents a further advantage of the present invention.

One method for achieving the objective of producing a target pin element layout for an enhanced IC, that supports inter-package migration involves placing the base pattern within the bounds of a target pattern as a subset of its pins, and assigning pin locations in that subset the same operational function as the pin in the corresponding location of the base layout. Each pin element of an IC package employing the target layout is then electrically coupled to circuitry of the IC chip associated with the function assigned to the pin element by virtue of the layout.

An IC package employing target pin layout 400 illustrated in FIG. 4 could be produced by the aforementioned method using pin pattern and layout 300 of FIG. 3 as the base. Base pattern 300 is placed within the bounds 499 of the target pattern as the subset of pins enclosed by perimeter 498. Pin locations resulting from the insertion of the base pattern are then assigned the same operational function as the pin in the corresponding location of the base layout. For example, pin element 410 of FIG. 4 receives the same functional assignment as pin element 310 of FIG. 3, i.e., the signal denoted as "DCLK." It is noted that functional assignments for individual pins are integral to extended layout 400 but are omitted, except for that of pin element 410, in order not to obscure the drawing with unnecessary detail. It is further noted that all of the pin elements located within perimeter 498 result from the base pattern. While this is the preferred practice, the invention is not so limited. Lastly, each pin element of an IC package employing the target layout is electrically coupled to circuitry of the package's IC chip associated with the function assigned to the pin element in accordance with the layout.

The described embodiment of the enhanced IC pin layout 400 also completely replicates the base layout within the target layout. Minor deviations may be employed without departing from the scope and spirit of the invention. With a PLD for example, a small number of power and I/O pins can often be omitted, but control signals generally cannot. Omitting pins as just described results in a conditional migration ability. To maintain inter-chip migration potential the users of the base chip should be instructed as to the possible absence of the omitted pins on enhanced devices. The user can thereby ensure that power conduction paths provided by the package carrier, e.g., a printed circuit board, do not rely on the presence of a certain power pin that is omitted from an enhanced layout. Similarly, a user can avoid the use of a particular I/O pin that is omitted from an enhanced layout in cases where the full capacity of the PLD is not needed by the circuit employing the base chip.

A second representative method for producing a target pin element layout that supports inter-package migration is now described as comprising the following steps. An existing base pin layout is identified with which a target pin layout is intended to be compatible for inter-package migration. A target pin pattern is identified that comprises a select subset of pin positions corresponding in number and relative positioning to the base pin pattern. A reference point is selected for the base pin layout by which to identify the individual pin positions within the base layout. A reference point is selected for the target pin layout by which to identify the individual pin positions within the target layout. The target reference point occupies a corresponding position relative to the target pattern's select subset of pin positions as the base reference point occupies relative to the pin positions of the base pin element pattern. For each pin in the target pattern's select subset, the pin's position relative to the target reference point is identified and a function is assigned to the pin such that the same operational function is assigned to the pin as that for the pin in the base layout occupying the corresponding position relative to the base reference point. Each pin element on an IC package employing the target layout is then electrically coupled to chip circuitry associated with the function assigned to the pin element by virtue of the layout.

An IC package employing target pin layout 400 illustrated in FIG. 4 could be produced by the aforementioned process using the pattern and layout of FIG. 3 as the base. Pin layout 300 of FIG. 3 is identified as the base pin layout with which a target pin layout is intended to be compatible for inter-package migration. Pin pattern 400 of FIG. 4 with pin subset 498 is identified as the target pin pattern comprising a select subset of pin positions corresponding in number and relative positioning to the base pin pattern. Reference point 301 of FIG. 3 is selected for the base pin layout by which to identify the individual pin positions within the base layout. Reference point 401 of FIG. 4 is selected for the target pin pattern by which to identify the individual pin positions within the target pattern. It is noted that reference point 401 occupies a corresponding (in fact, identical) position relative to the target pattern select subset of pin positions as base reference point 301 of FIG. 3 occupies relative to the pin positions of the base pin layout (points 301 and 401 are located at the geometric center of base pin layout 300 and pin subset 498, respectively). Although not specifically illustrated, the position of each pin in the target pattern's select subset would be identified relative to the target reference point, and the pin would be assigned the same operational function as that for the pin in the base layout occupying the corresponding position relative to the base reference point. For example, pin 410 of FIG. 4, located five pins down and one to the right of target reference point 401, is assigned the identical function to that of pin 310 in FIG. 3, which is located five pins down and one to the right of base reference point 301.

A third representative method for producing a target pin element layout that supports inter-package migration is now described as comprising the following steps. An existing base pin layout is identified with which a target pin layout is intended to be compatible for inter-package migration. The perimeter for a target pin pattern is identified that is capable of enclosing an area coextensive with the base pin pattern. A reference point is selected for the base pin layout by which to identify the individual pin positions within the base layout. A reference point is selected for the target pin layout by which to identify the individual pin positions within the target layout. The target reference point is no closer to the target pin pattern perimeter in any direction than the base reference point is to the base layout perimeter in a corresponding direction. The relative position of each pin in the base layout is determined in reference to the base reference point. For each relative position determined from the base layout, a pin is inserted in the target pattern in the same relative position in reference to the target reference point, and the pin is assigned the same function in the target layout as the corresponding pin has in the base layout. Each pin element on an IC package employing the target layout is then electrically coupled to chip circuitry associated with the function assigned to the pin element by virtue of the layout.

An IC package employing target pin layout 400 illustrated in FIG. 4 could be produced by the aforementioned process using the pattern and layout of FIG. 3 as the base. Pin layout 300 of FIG. 3 is identified as the base pin layout with which a target pin layout is intended to be compatible for inter-package migration. Perimeter 499 for a target pin pattern is identified as a perimeter capable of enclosing an area coextensive with the base pin pattern (for example, an area bounded by perimeter 498). Reference point 301 is selected for use in identifying the individual pin positions within the base layout. Reference point 401 is selected for use in identifying the individual pin positions within the target layout. Target reference point 401 is no closer to the target pin pattern perimeter 499 in any direction than the base reference point 301 is to the base layout perimeter 399 in a corresponding direction. The relative position of each pin in the base layout is determined in reference to the base reference point. For example, pin 310 is determined to be centered 5.5 mm below, and 1.5 mm left of, base reference point 301. For each relative position determined from the base layout, a pin is inserted in the target pattern in the same relative position in reference to the target reference point, and the pin is assigned the same function in the target layout as the corresponding pin has in the base layout. For example, pin 410 is centered in the target pattern 5.5 mm below, and 1.5 mm left of, target reference point 401, and is assigned the "DCLK" function. Each pin element on an IC package employing the target layout is then electrically coupled to chip circuitry associated with the function assigned to the pin element by virtue of the layout.

Target pin layout 400 of FIG. 4 for the extended IC package further includes the following pin assignments. Pin groups 442, 444, 446, and 448 make up a subset of pin elements assigned to carry power supply signals. Pin groups 442, 444, 446, and 448 are notably located along diagonal axes 404 and 406. This location characteristic facilitates making power supply connections near the corner contact and bonding pads of a lead frame and chip. As discussed earlier in reference to FIG. 2, these bonding locations possess inferior electrical characteristics. Of the PLD's three types of signals, however, the power supply signals are least impacted by the inferior aspects at these locations. Pin elements of layout 400 that are not included in the base layout correspondence subset 498, and that are not included in the extended power subset comprising pin groups 442, 444, 446, and 448, are assigned I/O functions. Lastly, each pin element on an IC package employing the target layout is then electrically coupled to chip circuitry associated with the function assigned to the pin element.

Figure 5:
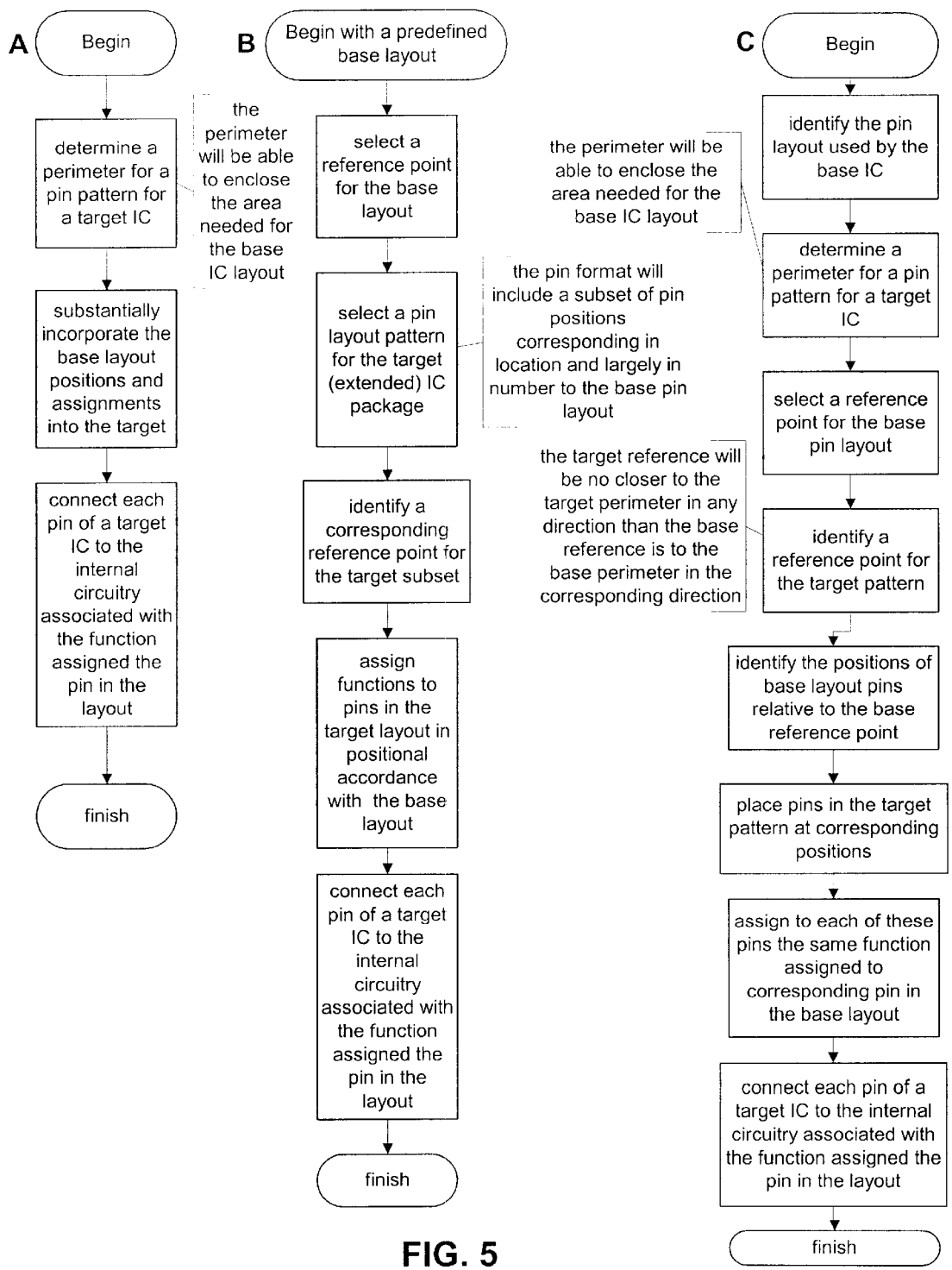
FIG. 5 depicts flowcharts of representative design methods for establishing a migration path between two IC packages.

FIG. 5 depicts flowcharts of representative design methods for establishing a migration path between two IC packages, as already described in reference to FIG. 4.

Various modifications to the preferred embodiment can be made without departing from the spirit and scope of the invention. For example, the invention has been described in reference to IC packages for PLD's but may have applicability to other IC's, with greatest advantage to those of modular functionality such as memory chips. And, for example, the invention has been described in reference to embodiments employing rectangular geometry for their schemes, patterns, and layouts, but one skilled in the art will recognize that other geometry's may be employed.

Thus, the foregoing description is not intended to limit the invention which is described in the appended claims in which:

1. A method for specifying pin assignments for a target integrated circuit (IC) package to achieve compatibility with a base integrated circuit package, comprising:

selecting a positional reference point for the pin layout of the base IC package;

selecting a pin pattern for the target IC package wherein said target pin pattern comprises a subset of pin positions corresponding in relative positioning and substantially in number to the pin layout of the base IC package;

identifying a target positional reference point having a position relative to said subset of pin positions and corresponding to the position said base reference point has relative to said base pin layout; and assigning functions to pins in the target pin pattern such that the same operational function is assigned to a pin occupying a position relative to the target positional reference point as any pin in said base layout occupying the corresponding position relative to said base positional reference point, producing a target pin layout.

2. The method of claim 1 further comprising electrically connecting each pin of an integrated circuit package employing said target pin layout to circuitry on the IC chip associated with the particular function assigned to the particular pin in accordance with said target pin layout.

3. An integrated circuit having functional pin assignments determined in accordance with the method of claim 1.

4. A method for specifying pin assignments for a target integrated circuit (IC) package to achieve compatibility with a base IC package, comprising:

identifying the pin layout utilized by said base IC;

determining a perimeter for a pin pattern for said target IC such that said perimeter is capable of enclosing the area occupied by the pin layout of said base IC package;

selecting a reference point for said base pin layout;

selecting a reference point for said target pattern such that said target reference point is no closer to said determined perimeter in any direction than said base reference point is to the perimeter of said base pin layout in a corresponding direction;

determining for each of a substantial number of pins in said base pin layout to relative position in reference to the base reference point;

including for each determined relative position a pin in said target pin pattern such that said pin occupies the determined relative position in reference to said target reference point; and assigning to each included pin the function associated with the pin of the base pin layout occupying the corresponding position, producing a target pin layout.

5. The method of claim 4 further comprising electrically connecting each pin of an integrated circuit package employing said target pin layout to circuitry on the IC chip associated with the particular function assigned to the particular pin in accordance with said target pin layout.

6. An integrated circuit having functional pin assignments determined in accordance with the method of claim 4.

7. A method for specifying pin assignments for a target integrated circuit package to achieve compatibility with the base integrated circuit package, comprising:

determining a perimeter for a pin pattern for said target IC such that said perimeter is capable of enclosing the area occupied by the pin layout of said base IC package;

incorporating substantially the pin positions and associated functional assignments represented by said base pin layout within the determined perimeter, producing a target pin layout.

8. The method of claim 7 further comprising electrically connecting each pin of an integrated circuit package employing said target pin layout to circuitry on the IC chip associated with the particular function assigned to the particular pin in accordance with said target pin layout.

9. An integrated circuit having functional pin assignments determined in accordance with the method of claim 7.

* * * * *